(12) United States Patent
Chen et al.

(10) Patent No.: US 10,910,290 B2
(45) Date of Patent: Feb. 2, 2021

(54) STRUCTURES AND METHODS FOR HEAT DISSIPATION OF SEMICONDUCTOR DEVICES

(71) Applicant: Taiwan Semiconductor Manufacturing Co., Ltd., Hsin-Chu (TW)

(72) Inventors: S. L. Chen, Hsin-Chu (TW); Chen-Hsuan Yen, Taichung (TW); Han-Tang Lo, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/788,696

(22) Filed: Oct. 19, 2017

(65) Prior Publication Data

US 2019/0122951 A1 Apr. 25, 2019

(51) Int. Cl.
*H01L 23/367* (2006.01)
*H01L 23/522* (2006.01)
*H01L 21/768* (2006.01)
*H01L 23/498* (2006.01)

(52) U.S. Cl.
CPC ...... *H01L 23/367* (2013.01); *H01L 21/76877* (2013.01); *H01L 23/3677* (2013.01); *H01L 23/49822* (2013.01); *H01L 23/49827* (2013.01); *H01L 23/5226* (2013.01)

(58) Field of Classification Search
CPC combination set(s) only.
See application file for complete search history.

(56) References Cited

U.S. PATENT DOCUMENTS

| | | | |
|---|---|---|---|
| 7,772,682 B1 * | 8/2010 | Zhang | H01L 23/3114 257/684 |
| 2007/0176295 A1 * | 8/2007 | Chinthakindi | H01L 23/5226 257/774 |
| 2008/0093746 A1 * | 4/2008 | Lee | H01L 23/53238 257/776 |
| 2018/0151467 A1 * | 5/2018 | Venugopal | H01L 23/3121 |

* cited by examiner

*Primary Examiner* — Nduka E Ojeh
(74) *Attorney, Agent, or Firm* — Duane Morris LLP

(57) ABSTRACT

A semiconductor structure is disclosed. In one example, the semiconductor structure includes: a device region having at least one semiconductor device; a dummy region in contact with the device region; and at least one thermal conductor embedded in the dummy region.

16 Claims, 6 Drawing Sheets

STRUCTURES AND METHODS FOR HEAT DISSIPATION OF SEMICONDUCTOR DEVICES

BACKGROUND

An integrated circuit (IC) typically includes a large number of electrical components, such as resistors, transistors, capacitors, etc., on a chip of semiconductor material. Technological advances in semiconductor materials and design have produced increasingly smaller and more complex circuits. Aggressive technology scaling for high performance integrated circuits has resulted in higher current densities in interconnection lines and devices, which in turn increases power dissipation. Generally, a significant amount of such dissipated power converts to heat, which thus causes a substantial rise in heat density.

Silicon-On-Insulator (SOI) technology is of growing importance in the field of integrated circuits. SOI technology involves forming transistors in a relatively thin layer of semiconductor material overlying a layer of insulating material. More particularly, SOI technology is characterized by the formation of a thin silicon layer for formation of the active devices over an insulating layer, such as an oxide, which is in turn formed over a substrate. Transistor sources and drains are formed, for example, by implantations into the silicon layer while transistor gates are framed by forming a patterned oxide and conductor layer structure. Such structures provide a significant gain in performance by having lower parasitic capacitance due to the insulator layer, an excellent subthreshold swing, a small leakage current, an effective suppression of a short channel effect, and so on.

On the other hand, there are significant disadvantages associated with SOI technology as well. For a bulk silicon field effect transistor, the heat generated in the device is substantially dissipated through a bulk silicon substrate. However, a SOI field effect transistor has a thick silicon oxide layer (generally in order of hundreds nanometers). Since the thermal conductivity of silicon oxide is much smaller than that of the bulk silicon, the heat dissipation from a channel to the substrate is hindered. Furthermore, the SOI field effect transistor includes a very thin silicon film, where the thermal conductivity of the silicon film is smaller than that of the bulk silicon due to a surface phonon scattering, thus making heat dissipation further suppressed. Therefore, as compared with the bulk silicon field effect transistor, the SOI field effect transistor has a significant self-heating effect, which adversely affects the electrical performance and reliability of the semiconductor device. For example, in order to manage central processing unit (CPU) power/heat dissipation, processor makers had to stop increasing clock rates and apply multi-core chip designs, which results in multi-threaded development paradigms and a non-linear increase in speed when compared to the number of processors.

In addition, with the introduction of 3D transistor technology, advanced semiconductor processes have led to a lack of internal cooling space in the transistor, which worsens the heat accumulation problem at the internal core of the transistor. As such, the heat dissipation issue has become a bottle neck in the design of semiconductor devices.

One existing approach for heat dissipation in a semiconductor device is to use external thermal conductors, e.g., heat sink, thermal grease, radiating fins, and cooling fans. But this cannot solve the heat accumulation problem within the semiconductor device. Another approach for heat dissipation is based on software control, where an alert is generated and some operation (e.g. underclocking) is applied on the device when temperature of the device reaches a threshold. Again, this approach cannot solve the heat accumulation problem within the semiconductor device. In addition, this approach sacrifices the performance of the device. Thus, conventional techniques for heat dissipation of semiconductor devices are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout the specification and drawings.

DETAILED DESCRIPTION OF EXEMPLARY EMBODIMENTS

Figure 1:
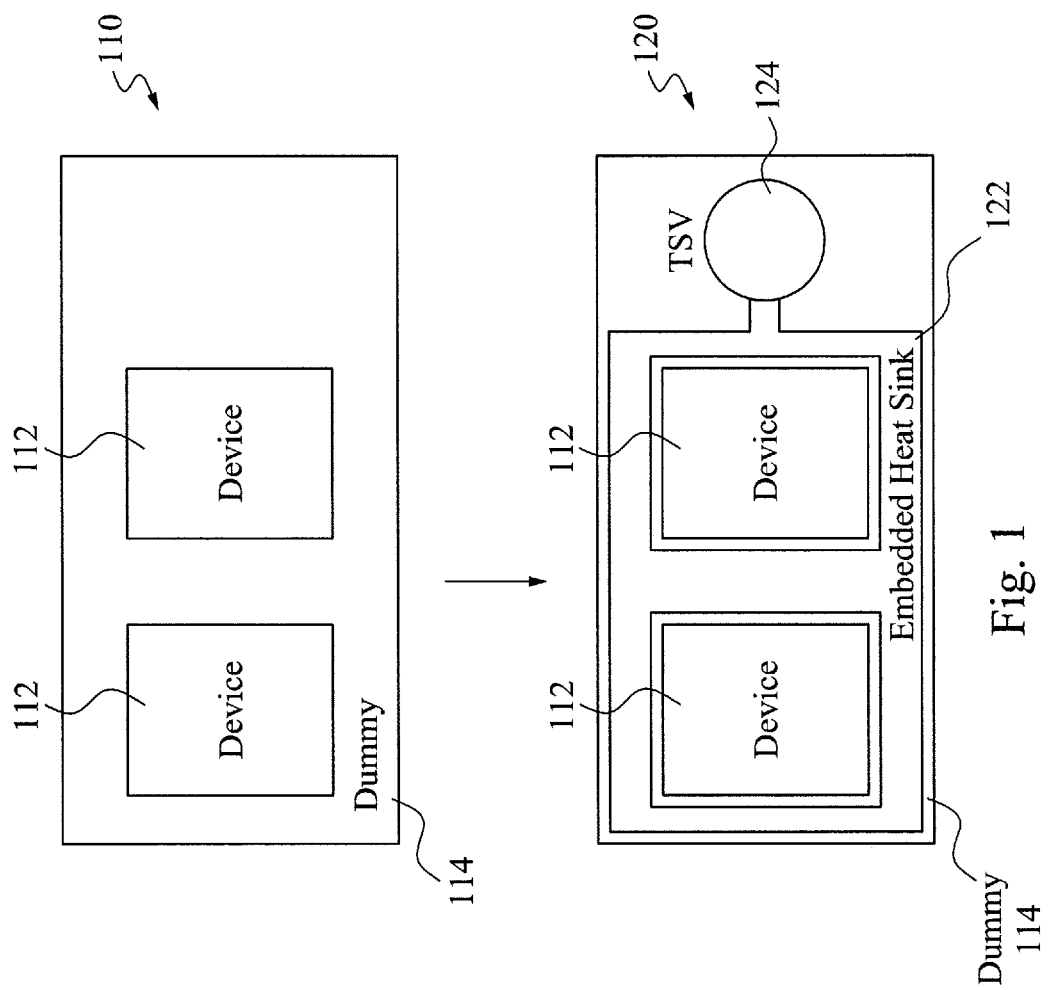
FIG. 1 illustrates a top view of an exemplary semiconductor structure, in accordance with various embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reduction in size of semiconductor devices, SOI field effect transistors are widely used in the semiconductor industry with advantages such as an excellent subthreshold swing, a small leakage current, an effective suppression of a short channel effect, and so on. On the other hand, as compared with the bulk silicon field effect transistor, the SOI field effect transistor has a significant disadvantage of self-heating effect, which adversely affects the electrical performance and reliability of the semiconductor device. In addition, with the introduction of 3D transistor technology, advanced semiconductor processes have led to a lack of internal cooling space in the transistor, which worsens the heat accumulation problem at the internal core of the transistor. The heat dissipation issue has become a bottle neck in the design of semiconductor devices.

The present disclosure aims at improving heat dissipation of a semiconductor structure by novel device designs to reduce heat accumulation effects in the semiconductor structure. The present disclosure provides various embodiments of a semiconductor structure that includes a device region having at least one semiconductor device; a dummy region in contact with the device region; and at least one thermal conductor embedded in the dummy region. The at least one thermal conductor can collect waste heat from the device, and transfer the waste heat out of the device either by an inter-connect via or through a through-silicon via (TSV). As such, the waste heat is timely dissipated and not accumulated within the semiconductor structure.

A device region on a semiconductor chip may be designed to form a functional integrated circuit while a dummy region on the semiconductor chip may be designed to form various dummy features to enhance various semiconductor manufacturing processes, improve the functional integrated circuit, and/or isolate different device regions on the chip. In some embodiments, the embedded thermal conductor is formed of a thermally conductive material that increases an average thermal conductivity of the dummy region and thermally couples the at least one semiconductor device to the via or TSV. That is, the embedded thermal conductor transfers waste heat from the device to the via or TSV, which in turn transfers the waste heat out of the chip through an external thermal conductor (e.g. a thermal bump, a heat sink, and/or a heat pipe) on a surface of the chip.

In some embodiments, the inter-connect via in the dummy region may have a similar structure as a device in the device region to make the manufacturing process easy without extra cost. For example, the semiconductor device and the inter-connect via share at least one of the following: a contact layer formed of tungsten; a metal layer formed of copper; and an interconnect layer formed of aluminum. The embedded thermal conductor may either serve as the metal layer or be thermally coupled to the metal layer. While the semiconductor device may be connected to a power source to work and generate heat, the inter-connect via can be connected to an external thermal conductor (e.g. a thermal bump, a heat sink, and/or a heat pipe) to dissipate the heat out of the chip.

The present disclosure is applicable to all kinds of semiconductor device structures, especially those semiconductor devices with high performance requirements, e.g. cellphones, CPU (central processing unit), GPU (graphics processing unit), etc. When overheat accumulation is well-controlled, a semiconductor device can work under a higher voltage and power. As such, based on the improved heat dissipation structure and method in the present disclosure, a designer is afforded more flexibility when designing devices since higher voltage/power designs can be implemented. For example, a chip designer can apply a wider working voltage range on the device and stop using an underclocking mechanism, thereby meeting new business and/or application requirements.

FIG. 1 illustrates a top view of an exemplary semiconductor structure, in accordance with various embodiments of the present disclosure. As shown in FIG. 1, a basic semiconductor structure 110 includes several device regions 112, and a dummy region 114 disposed between the several device regions 112. The device region 112 is designed to form a functional integrated circuit while the dummy region 114 is designed to form various dummy features to enhance various semiconductor manufacturing processes, improve the functional integrated circuit, and/or isolate the different device regions. Waste heat may be generated at the device regions 112 during the operation of the devices in the device regions 112, and dissipated into the dummy region 114. As the original material of the dummy region 114 is merely used for dummy features and isolation, it may not have a high thermal conductivity to further conduct or dissipate the waste heat.

As such, a heat sink 122 may be embedded into the dummy region 114 of the semiconductor structure 110 to form a semiconductor structure 120, in accordance with various embodiments of the present disclosure. The embedded heat sink 122 may be formed of a thermally conductive material that will increase the average thermal conductivity of the dummy region 114. For example, the embedded heat sink 122 may be formed of copper, diamond, Graphene, etc. The embedded heat sink 122 can collect waste heat generated by the devices.

In some embodiments, the semiconductor structure 120 also includes a TSV 124 in the dummy region 114. The TSV 124 consists of a hole filled with a thermally conductive material that is the same as or different from that of the embedded heat sink 122, in accordance with various embodiments. The embedded heat sink 122 thermally couples the devices to the TSV 124 such that the embedded heat sink 122 can transfer the waste heat to the TSV 124, which may in turn transfer the waste heat out of the semiconductor structure 120 through an external thermal conductor (not shown) on a surface of the semiconductor structure 120, thereby decreasing the temperature of the semiconductor structure 120 and avoiding heat accumulation within the semiconductor structure 120. The external thermal conductor may include, e.g. a wide thermal bump, an external heat sink, and/or a heat pipe.

Figure 2:
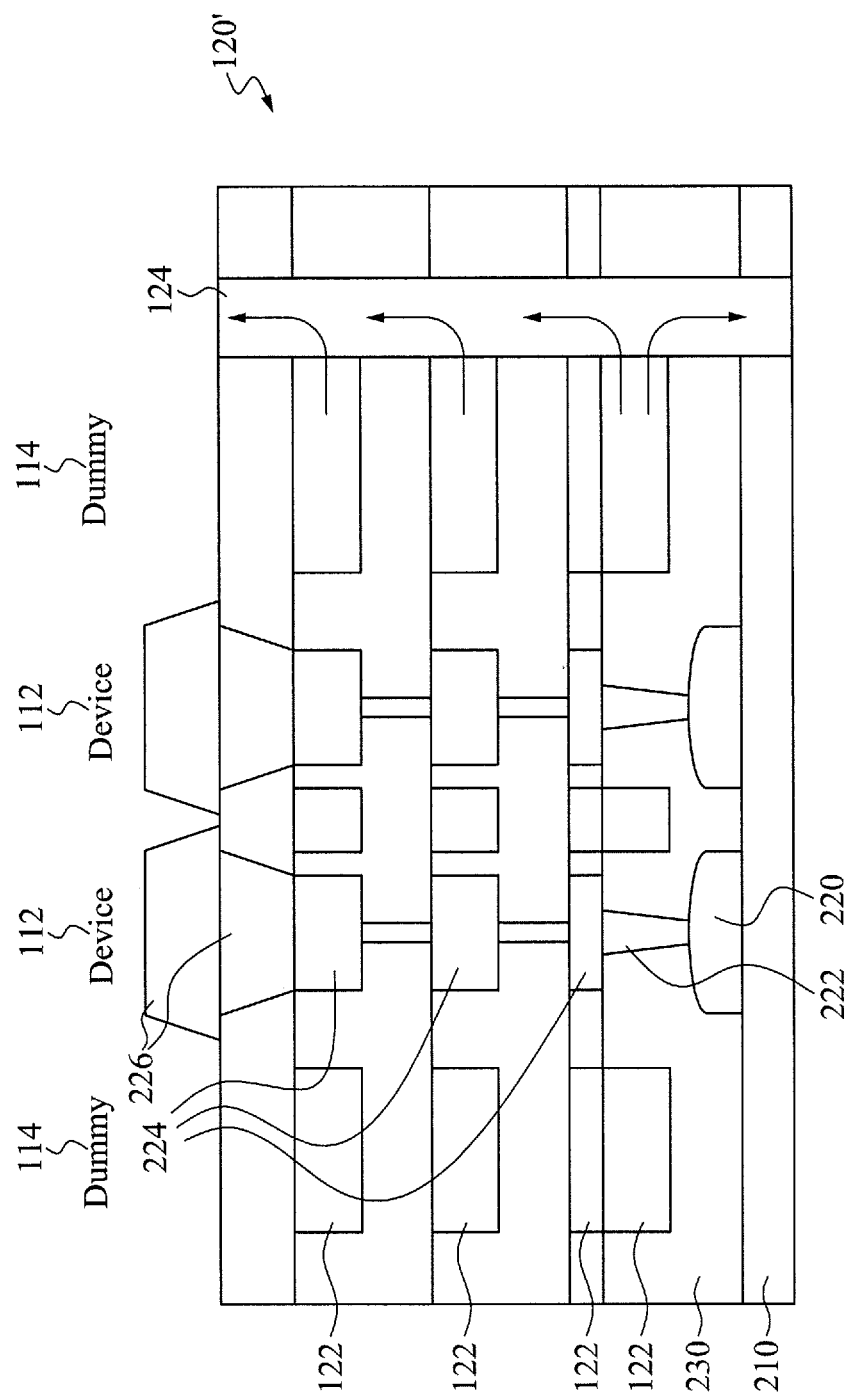
FIG. 2 illustrates a corresponding cross-sectional view of the exemplary semiconductor structure shown in FIG. 1, in accordance with some embodiments of the present disclosure.

FIG. 2 illustrates a corresponding cross-sectional view 120' of the exemplary semiconductor structure 120 (e.g. a semiconductor chip) shown in FIG. 1, in accordance with some embodiments of the present disclosure. In the cross-sectional view 120', device regions 112 and dummy regions 114 are all disposed on a substrate 210. The substrate 210 may be a bulk silicon substrate or an SOI substrate. In each device region 112, a device 220 is disposed on the substrate 210. In one embodiment, the device 220 may be formed of polysilicon to perform a particular function. A contact layer 222 is disposed on the device 220. In one embodiment, the contact layer 222 may be formed of tungsten. One or more metal layers 224 are disposed on the contact layer 222. In one embodiment, the one or more metal layers 224 may be formed of copper or other metals. An interconnect layer 226 is disposed on the one or more metal layers 224. In one embodiment, the interconnect layer 226 may be formed of aluminum.

In some embodiments, packaging material is disposed on the interconnect layer 226, where a power source (not shown) may be connected to the device through the packaging material. For example, after a voltage is applied by the power source on the device 220, the device 220 operates to perform a function and generates waste heat at the same time. It can be understood that the waste heat is not only generated at the device 220, but also generated at the contact layer 222 and the one or more metal layers 224 that are electrically connected to the power source.

The device regions 112 are separated by an isolation material 230 in the dummy region 114. While the isolation material 230 can electrically isolate the devices, it does not conduct heat very well. As such, waste heat would be accumulated within the dummy region 114 if there is no embedded heat sink.

As shown in the cross-sectional view 120', one or more heat sink layers 122 are embedded in the dummy regions 114. The one or more heat sink layers 122 may be formed of a thermally conductive material, such as copper, diamond, Graphene, etc. Different heat sink layers 122 may be formed of different thermally conductive materials. The thermally conductive material may have a higher thermal conductivity than the isolation material 230 originally disposed in the dummy regions 114. The embedded heat sinks 122 may collect waste heat generated from the device regions 112.

As shown in the cross-sectional view 120', the TSV 124 is disposed in the dummy region 114 as well. As shown in FIG. 2, the TSV 124 may be filled up with a thermally conductive material that is the same as or different from that of the one or more heat sink layers 122, in accordance with various embodiments. The one or more heat sink layers 122 are thermally connected to the TSV 124, such that the one or more heat sink layers 122 can conduct the waste heat collected from the device regions 112 to the TSV 124, due to high thermal conductivity of the embedded heat sinks. The thermally conductive material in the TSV 124 can in turn conduct the waste heat to a top surface of the semiconductor chip 120', a bottom surface of the semiconductor chip 120', or both, depending on customer requirement. The waste heat will then be transferred out of the semiconductor chip 120' through an external thermal conductor (e.g. a thermal bump, a heat sink, and/or a heat pipe) on a corresponding surface of the semiconductor chip 120'.

It can be understood that the dummy regions 114 shown in FIG. 2 are connected as one dummy region as shown in FIG. 1. Similarly, while the embedded heat sink includes multiple layers as shown in FIG. 2, each heat sink layer includes connected heat sinks as shown in FIG. 1. As such, the waste heat collected by all embedded heat sinks at one layer can be transferred to the TSV 124; and one TSV 124 can be enough to conduct waste heat collected by all heat sink layers to a surface of the semiconductor chip 120'. It can be understood that in some embodiments, there can be multiple TSVs 124 in the semiconductor chip 120' to conduct heat out of the chip to avoid waste heat accumulation.

Figure 3:
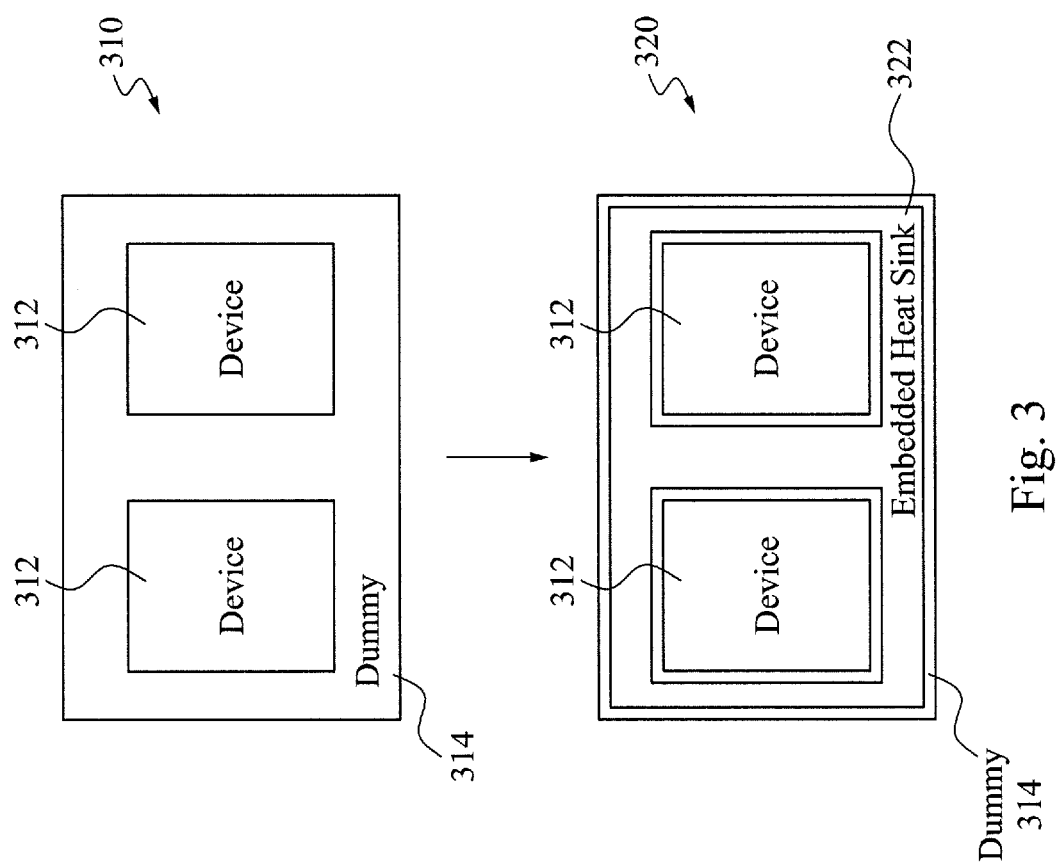
FIG. 3 illustrates a top view of another exemplary semiconductor structure, in accordance with some embodiments of the present disclosure.

FIG. 3 illustrates a top view of another exemplary semiconductor structure, in accordance with some embodiments of the present disclosure. As shown in FIG. 3, a basic semiconductor structure 310 includes several device regions 312, and a dummy region 314 disposed between the several device regions 312. The device region 312 is designed to form a functional integrated circuit while the dummy region 314 is designed to form various dummy features to enhance various semiconductor manufacturing processes, improve the functional integrated circuit, and/or isolate the different device regions. Waste heat may be generated at the device regions 312 during the operation of the devices in the device regions 312, and dissipated into the dummy region 314. As the original material of the dummy region 314 is merely used for dummy features and isolation, it may not have a high thermal conductivity to further conduct or dissipate the waste heat.

As such, a heat sink 322 may be embedded into the dummy region 314 of the semiconductor structure 310 to form a semiconductor structure 320, in accordance with various embodiments of the present disclosure. The embedded heat sink 322 may be formed of a thermally conductive material that will increase the average thermal conductivity of the dummy region 314. For example, the embedded heat sink 322 may be formed of copper, diamond, Graphene, etc. The embedded heat sink 322 can collect waste heat generated by the devices.

In some embodiments, the embedded heat sink 322 can transfer the collected waste heat to an external thermal conductor on a surface of the semiconductor structure 320. The external thermal conductor may be a wide thermal bump, an external heat sink, and/or a heat pipe.

Figure 4:
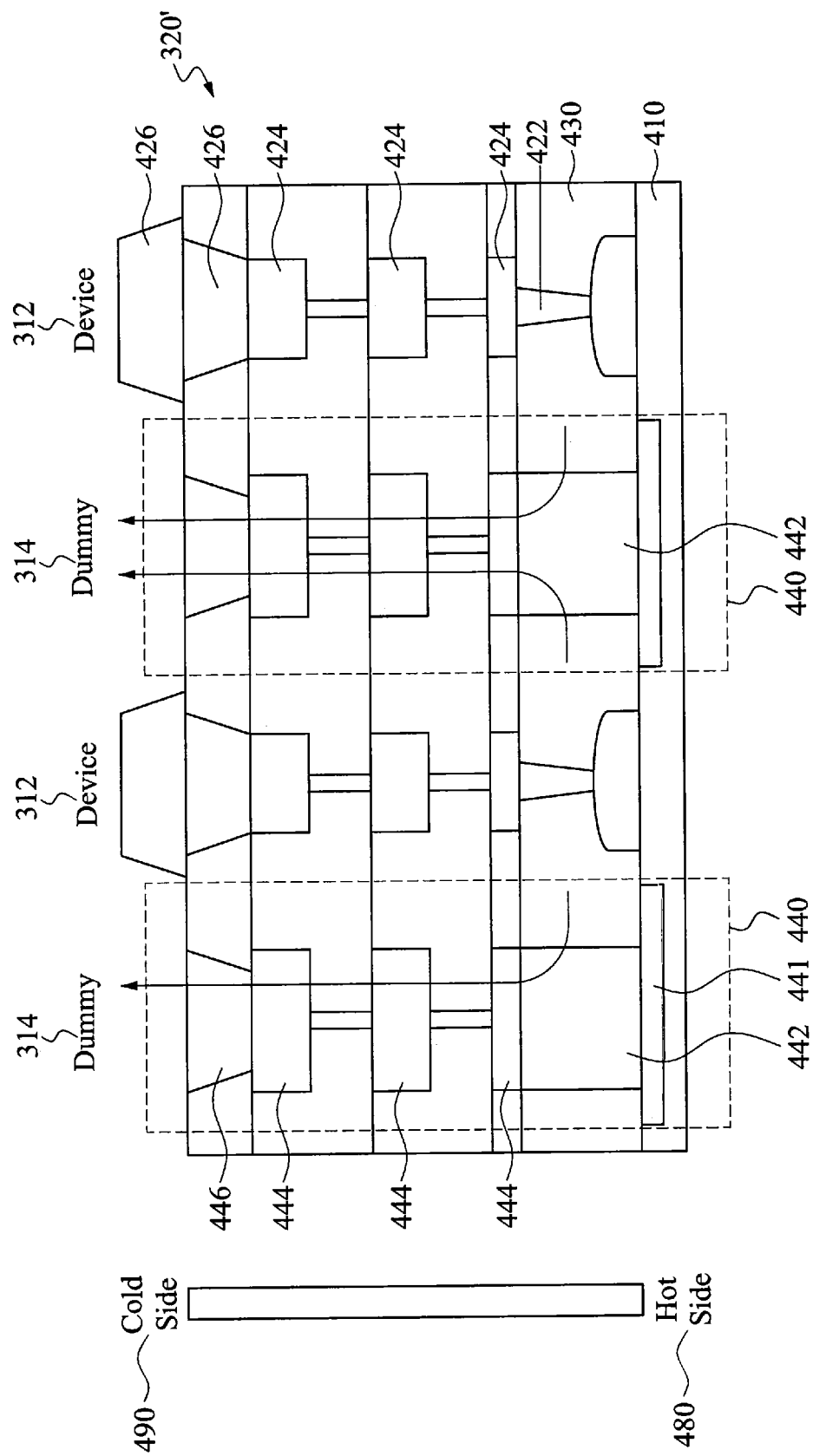
FIG. 4 illustrates a corresponding cross-sectional view of the exemplary semiconductor structure shown in FIG. 3, in accordance with some embodiments of the present disclosure.

FIG. 4 illustrates a corresponding cross-sectional view 320' of the exemplary semiconductor structure 320 (e.g. a semiconductor chip) shown in FIG. 3, in accordance with some embodiments of the present disclosure.

In the cross-sectional view 320', device regions 312 and dummy regions 314 are all disposed on a substrate 410. The substrate 410 may be a bulk silicon substrate or an SOI substrate. In each device region 312, a device 420 is disposed on the substrate 410. In one embodiment, the device 420 may be formed of polysilicon to perform a particular function. A contact layer 422 is disposed in each device region 312 on the device 420. In one embodiment, the contact layer 422 may be formed of tungsten. In each device region 312, one or more metal layers 424 are disposed on the contact layer 422. In one embodiment, the one or more metal layers 424 may be formed of copper or other metals. In each device region 312, an interconnect layer 426 is disposed on the one or more metal layers 424. In one embodiment, the interconnect layer 426 may be formed of aluminum.

In some embodiments, packaging material is disposed on the interconnect layer 426, where a power source (not shown) may be connected to the device through the packaging material. For example, after a voltage is applied by the power source on the device 420, the device 420 operates to perform a function and generates waste heat at the same time. It can be understood that the waste heat is not only generated at the device 420, but also generated at the contact layer 422 and the one or more metal layers 424 that are electrically connected to the power source.

FIG. 4 also shows an illustrative heat distribution along a vertical dimension of the semiconductor structure 320'. As illustrated by the heat distribution, the semiconductor structure 320' has a hottest spot at the bottom side 480 where the devices 420 generate lots of heat during operation, and has a coldest spot at the top side 490 that is far from and opposite of the hot side.

The device regions 312 are separated by an isolation material 430 in the dummy region 314. While the isolation material 430 can electrically isolate the devices, it does not conduct heat very well. As such, waste heat would be accumulated within the dummy region 314 if there is no embedded heat sink.

As shown in the cross-sectional view 320', one or more inter vias 440 are embedded in the dummy regions 314. In this embodiment, an inter via 440 is disposed between each adjacent pair of devices 312. The embedded inter via 440 may collect waste heat generated from the device regions 312 and conduct the waste heat to a top surface of the semiconductor chip 320', a bottom surface of the semiconductor chip 320', or both, depending on customer design requirement. The waste heat will then be transferred out of the semiconductor chip 320' through an external thermal conductor (e.g. a thermal bump, a heat sink, and/or a heat pipe) on a corresponding surface of the semiconductor chip 320'. In this case, there is no need for a TSV as shown in FIG. 2.

In one embodiment, each inter via 440 has a similar structure to the structure of the device. For example, as shown in FIG. 4, each inter via 440 includes a shallow trench isolation (STI) layer 441 disposed on the substrate 410 to prevent electric current leakage. Each inter via 440 further includes a contact layer 442 that is disposed on the STI layer 441; one or more metal layers 444 that are disposed on the contact layer 442; and an interconnect layer 446 that is disposed on the one or more metal layers 444. In one embodiment, the contact layer 442 in the dummy region 314 may be aligned with the contact layer 422 in the device region 312 and formed of a same material, e.g. tungsten, as the contact layer 422. The one or more metal layers 444 in the dummy region 314 may be aligned with the one or more metal layers 424 in the device region 312 and formed of a same material, e.g. copper, as the one or more metal layers 424. The interconnect layer 446 in the dummy region 314 may be aligned with the interconnect layer 426 in the device region 312 and formed of a same material, e.g. aluminum, as the interconnect layer 426. A difference between the interconnect layer 446 and interconnect layer 426 is that: the interconnect layer 426 in the device region 312 is connected to a power source (not shown) through a packaging material, while the interconnect layer 446 in the dummy region 314 is connected to an external thermal conductor (e.g. a thermal bump, a heat sink, and/or a heat pipe) to dissipate the waste heat out of the semiconductor chip 320'. The similarity between the inter vias 440 and the devices can make the chip manufacturing process very easy without introducing extra cost when the inter vias 440 are embedded. But it can be understood that in some embodiments, the inter vias 440 may have different structure and/or material than that of the devices.

The embedded heat sink 322 may either serve as the metal layers 444 or be located (not shown) between the metal layers 424 and the metal layers 444 to transfer the heat generated by the device regions 312 to the inter vias 440. The embedded heat sink 322 may be formed of a thermally conductive material, such as copper, diamond, Graphene, etc. When the embedded heat sink 322 includes multiple layers, different heat sink layers may be formed of different thermally conductive materials. The thermally conductive material may have a higher thermal conductivity than the isolation material 430 in the dummy regions 314.

It can be understood that the dummy regions 314 shown in FIG. 4 are connected as one dummy region as shown in FIG. 3. Similarly, the multiple inter vias 440 shown in FIG. 4 may be thermally connected as shown in FIG. 3, e.g. through the metal layers 444. As such, the waste heat collected by all inter vias 440 can be conducted out of the chip to avoid waste heat accumulation, by any one or more of the inter vias 440. In this case, since all inter vias 440 are thermally connected, an external thermal conductor (e.g. a thermal bump, a heat sink, and/or a heat pipe) may be thermally connected to one or more of the inter vias 440 to dissipate heat out of the semiconductor chip 320'.

Figure 5:
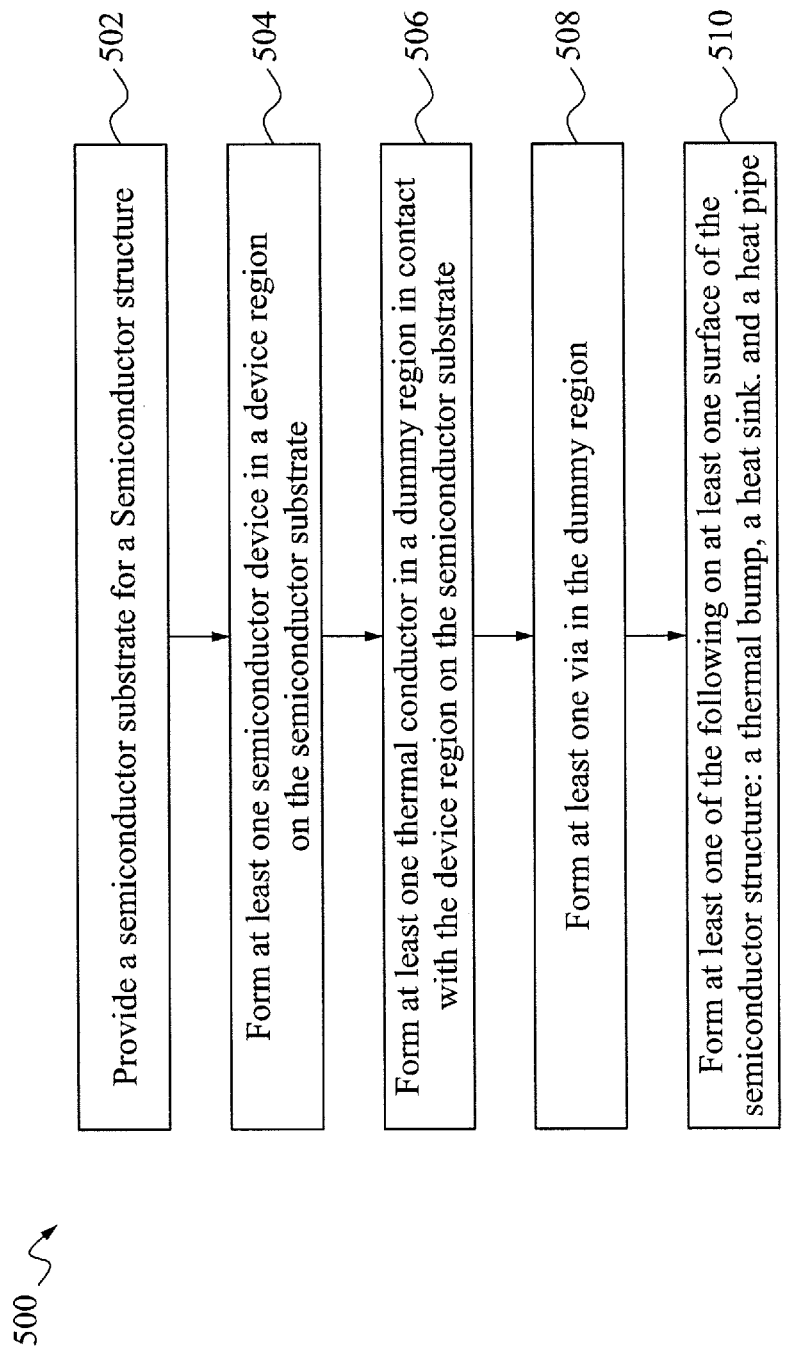
FIG. 5 is a flow chart illustrating an exemplary method for forming a semiconductor structure, in accordance with some embodiments of the present disclosure.

FIG. 5 is a flow chart illustrating an exemplary method 500 for forming a semiconductor structure, in accordance with some embodiments of the present disclosure. As shown in FIG. 5, a semiconductor substrate is provided at operation 502 for forming a semiconductor structure. At least one semiconductor device is formed at operation 504 in a device region on the semiconductor substrate. At least one thermal conductor is formed at operation 506 in a dummy region that is in contact with (or adjacent to) the device region on the semiconductor substrate. At operation 508, at least one via, e.g. a TSV, is formed in the dummy region. At operation 510, at least one of the following external thermal conductors is formed on at least one surface of the semiconductor structure: a thermal bump, a heat sink, and a heat pipe. In this embodiment, the thermal conductor transfers heat generated by the semiconductor device to the TSV, which can in turn transfer the heat out of the semiconductor structure through the external thermal conductor on a surface of the semiconductor structure.

Figure 6:
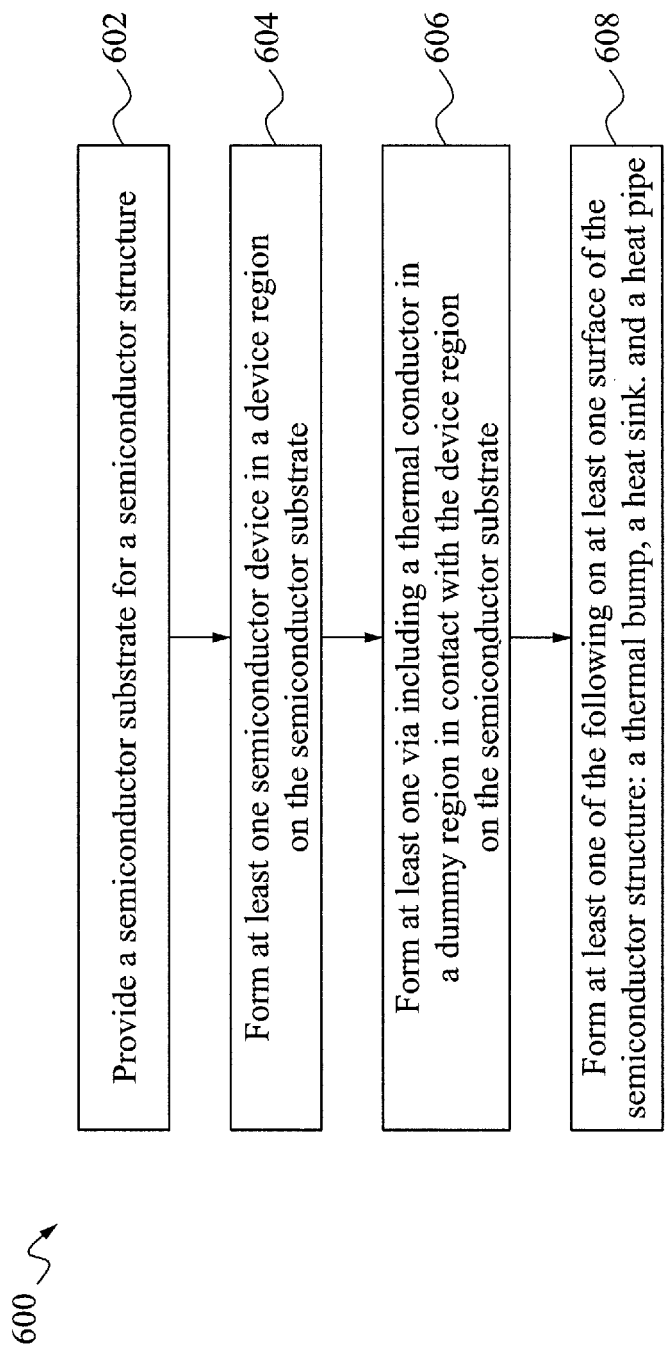
FIG. 6 is a flow chart illustrating another exemplary method for foil ling a semiconductor structure, in accordance with some embodiments of the present disclosure.

FIG. 6 is a flow chart illustrating another exemplary method 600 for forming a semiconductor structure, in accordance with some embodiments of the present disclosure. As shown in FIG. 6, a semiconductor substrate is provided at operation 602 for forming a semiconductor structure. At least one semiconductor device is formed at operation 604 in a device region on the semiconductor substrate. At least one inter via including a thermal conductor is formed at operation 606 in a dummy region that is in contact with (or adjacent to) the device region on the semiconductor substrate. At operation 608, at least one of the following external thermal conductors is formed on at least one surface of the semiconductor structure: a thermal bump, a heat sink, and a heat pipe. In this embodiment, the inter via including the thermal conductor transfers heat generated by the semiconductor device out of the semiconductor structure through the external thermal conductor on a surface of the semiconductor structure.

It can be understood that the order of the steps shown in each of FIG. 5 and FIG. 6 may be changed according to different embodiments of the present disclosure.

In an embodiment, a semiconductor structure is disclosed. The semiconductor structure includes: a device region having at least one semiconductor device; a dummy region in contact with the device region; and at least one thermal conductor embedded in the dummy region.

In another embodiment, a method for forming a semiconductor structure is disclosed. The method includes: providing a semiconductor substrate; forming at least one semiconductor device in a device region on the semiconductor substrate; and forming at least one thermal conductor in a dummy region on the semiconductor substrate. The dummy region is in contact with the device region.

In yet another embodiment a method for forming a semiconductor structure is disclosed. The method includes: providing a semiconductor substrate; forming at least one semiconductor device in a device region on the semiconductor substrate; and forming at least one via in a dummy region on the semiconductor substrate. The dummy region is in contact with the device region. The at least one via thermally couples the at least one semiconductor device to at least one surface of the semiconductor structure.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   at least one device region having a plurality of semiconductor devices;
   a dummy region in contact with the at least one device region;
   at least one thermal conductor embedded in the dummy region;
   a plurality of vertical interconnect accesses (vias) each of which is disposed in the dummy region and thermally couples the at least one thermal conductor to at least one surface of the semiconductor structure,
   wherein the plurality of semiconductor devices and the plurality of vias share the following layers in a same order from bottom to top:
      a contact layer formed of tungsten,
      a plurality of metal layers formed of copper and formed on the contact layer, and
      a top layer formed of aluminum and formed on the plurality of metal layers.

2. The semiconductor structure of claim 1, wherein embedding of the at least one thermal conductor increases an average thermal conductivity of the dummy region.

3. The semiconductor structure of claim 1, wherein the at least one thermal conductor is formed of a thermally conductive material that thermally couples the plurality of semiconductor devices to the plurality of vias.

4. The semiconductor structure of claim 1, wherein each of the plurality of vias thermally couples the at least one thermal conductor to at least one of the following on the at least one surface: a thermal bump, a heat sink, and a heat pipe.

5. The semiconductor structure of claim 1, further comprising a substrate; a bottom surface below the substrate; and a top surface opposite to the bottom surface.

6. The semiconductor structure of claim 1, wherein the at least one thermal conductor serves as at least one of the plurality of metal layers in the plurality of vias.

7. The semiconductor structure of claim 1, wherein the top layer is an interconnect layer formed of aluminum and formed on the plurality of metal layers.

8. A method for forming a semiconductor structure, comprising:
   providing a semiconductor substrate;
   forming a plurality of semiconductor devices in at least one device region on the semiconductor substrate;
   forming at least one thermal conductor in a dummy region on the semiconductor substrate, wherein the dummy region is in contact with the at least one device region;
   forming a plurality of vias in the dummy region, wherein each of the plurality of vias thermally couples the at least one thermal conductor to at least one surface of the semiconductor structure,
   wherein the plurality of semiconductor devices and the plurality of vias share the following layers in a same order from bottom to top:
      a contact layer formed of tungsten,
      a plurality of metal layers formed of copper and formed on the contact layer, and
      a top layer formed of aluminum and formed on the plurality of metal layers.

9. The method of claim 8, wherein forming the at least one thermal conductor in the dummy region increases an average thermal conductivity of the dummy region.

10. The method of claim 8, wherein the at least one thermal conductor is formed of a thermally conductive material that thermally couples the plurality of semiconductor devices to the plurality of vias.

11. The method of claim 8, further comprising forming at least one of the following on the at least one surface: a thermal bump, a heat sink, and a heat pipe.

12. The method of claim 8, wherein:
   the semiconductor structure has a bottom surface below the substrate and a top surface opposite to the bottom surface.

13. A method for forming a semiconductor structure, comprising:
   providing a semiconductor substrate;
   forming a plurality of semiconductor devices in at least one device region on the semiconductor substrate;
   forming a plurality of vias in a dummy region on the semiconductor substrate, wherein the dummy region is in contact with the at least one device region and each of the plurality of vias thermally couples the plurality of semiconductor devices to at least one surface of the semiconductor structure,
   wherein the plurality of semiconductor devices and the plurality of vias share the following layers in a same order from bottom to top:
      a contact layer formed of tungsten,
      a plurality of metal layers formed of copper and formed on the contact layer, and
      a top layer formed of aluminum and formed on the plurality of metal layers.

14. The method of claim 13, wherein the plurality of vias comprises a thermally conductive material that increases an average thermal conductivity of the dummy region.

15. The method of claim 13, further comprising forming at least one of the following on the at least one surface: a thermal bump, a heat sink, and a heat pipe.

16. The method of claim 13, wherein the top layer is an interconnect layer formed of aluminum and formed on the plurality of metal layers.

* * * * *